United States Patent
Suzuki et al.

(10) Patent No.: US 6,458,476 B1
(45) Date of Patent: Oct. 1, 2002

(54) ORGANIC LUMINESCENCE DEVICE WITH SPIRO COMPOUND

(75) Inventors: Koichi Suzuki, Yokohama; Yuichi Hashimoto, Tokyo; Akihiro Senoo, Kawasaki; Kazunori Ueno, Ebina, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 64 days.

(21) Appl. No.: 09/768,499

(22) Filed: Jan. 25, 2001

(30) Foreign Application Priority Data

Jan. 27, 2000 (JP) ......................... 2000-019242

(51) Int. Cl.[7] .............................................. H05B 33/12
(52) U.S. Cl. ....................... 428/690; 428/917; 313/504; 313/506; 257/40; 257/103
(58) Field of Search ................................ 428/690, 917; 313/504, 506; 257/40, 103; 556/406; 549/29, 80; 548/400, 407, 528, 529

(56) References Cited

U.S. PATENT DOCUMENTS

| | | | |
|---|---|---|---|
| 4,539,507 A | 9/1985 | VanSlyke et al. | 313/504 |
| 4,720,432 A | 1/1988 | VanSlyke et al. | 428/457 |
| 4,885,211 A | 12/1989 | Tang et al. | 428/457 |
| 5,130,603 A | 7/1992 | Tokailin et al. | 313/504 |
| 5,151,629 A | 9/1992 | VanSlyke | 313/504 |
| 5,227,252 A | 7/1993 | Murayama et al. | 428/690 |
| 5,247,190 A | 9/1993 | Friend et al. | 257/40 |
| 5,317,169 A | 5/1994 | Nakano et al. | 257/40 |
| 5,344,501 A | 9/1994 | Hashimoto et al. | 136/259 |
| 5,382,477 A | 1/1995 | Saito et al. | 428/690 |
| 5,409,783 A | 4/1995 | Tang et al. | 428/690 |
| 5,514,878 A | 5/1996 | Holmes et al. | 257/40 |
| 5,672,678 A | 9/1997 | Holmes et al. | 528/373 |
| 5,840,217 A | 11/1998 | Lupo et al. | 252/583 |
| 6,017,644 A | 1/2000 | Toshida et al. | 428/690 |

FOREIGN PATENT DOCUMENTS

| | | |
|---|---|---|
| JP | 2-247278 | 10/1990 |
| JP | 3-255190 | 11/1991 |
| JP | 4-145192 | 5/1992 |
| JP | 5-202356 | 8/1993 |
| JP | 5-247460 | 9/1993 |
| JP | 7-278537 | 10/1995 |
| JP | 9-202878 | 8/1997 |
| JP | 9-227576 | 9/1997 |

OTHER PUBLICATIONS

C.W. Tang et al., "Organic Electroluminescent Diodes," 51(12) *Appl. Phys. Lett.* 913–915 (Sep. 1987).
J.H. Burroughes et al., "Light–Emitting Diodes Based on Conjugated Polymers," 347 Nature 539–541 (Oct. 1990).
Ari Aviram, "Molecules for Memory, Logic, and Amplification," 110 *J. Am. Chem. Soc.* 5687–56–92 (1988), (No Month).
R. Wu et al., "Convergent Synthetic Routes to Orthogonally Fused Conjugated Oligomers Directed Toward Molecular Scale Electronic Device Applications," 61 *J. Org. Chem.* 6906–6921 (1996), (No Month).

*Primary Examiner*—Marie Yamnitzky
(74) *Attorney, Agent, or Firm*—Fitzpatrick, Cella, Harper & Scinto

(57) ABSTRACT

An organic luminescence device is formed by disposing a layer of organic compound between a pair of an anode and a cathode. An organic luminescence device exhibiting orange to red luminescence at a good durability is provided by including an organic compound layer containing a spiro compound selected from a specific class, e.g., one represented by the following structural formula:

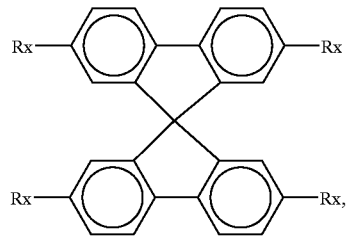

wherein Rx represents

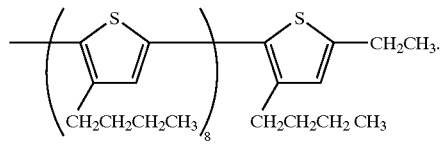

4 Claims, 1 Drawing Sheet

ORGANIC LUMINESCENCE DEVICE WITH SPIRO COMPOUND

FIELD OF THE INVENTION AND RELATED ART

The present invention relates to an organic (electro-) luminescence device and particularly to an organic luminescence device for emitting light by applying an electric field to a film of an organic compound (organic compound layer).

An organic luminescence device generally comprises a pair of electrodes (comprising an anode and a cathode) and a film comprising a fluorescent organic compound disposed between the electrodes. Into the organic compound layer (film), holes and electrons are injected from the anode and the cathode, respectively, thus forming excitons of the fluorescent organic compound. When the excitons are returned to ground state, the organic luminescence device emits light or causes luminescence.

According to a study by Eastman Kodak Co. ("Appl. Phys. Lett.", vol. 51, pp. 913- (1987)), it has been reported that a function-separation type organic luminescence layer comprising mutually laminated two layers including a layer of an aluminum quinolinol complex (as an electron transporting and luminescent material) and a layer of a triphenylamine derivative (as a hole transporting material) causes luminescence at a luminance (brightness) of ca. 1,000 cd/m² under application of a voltage of ca. 10 volts. This is also reported in, e.g., U.S. Pat. Nos. 4,539,507; 4,720,432 and 4,885,211.

Further, by changing species of the fluorescent organic compound, it is possible to effect luminescence over broad wavelength regions ranging from an ultraviolet region to an infrared region. In this regard, various compounds have been extensively studied in recent years. Such compounds have been proposed in, e.g., U.S. Pat. Nos. 5,151,629, 5,409,783 and 5,382,477, and Japanese Laid-Open Patent Applications (JP-A) 2-247278, JP-A 3-255190, JP-A 5-202356, JP-A 9-202878 and JP-A 9-227576.

In addition to the above-mentioned organic luminescence devices using low-molecular weight materials, an organic luminescence device using a conjugated polymer has been reported by a research group of Cambridge University ("Nature", vol. 347, pp. 539- (1990)). According to this report, a signal layer of polyphenylenevinylene (PPV) is formed through a wet-coating process and luminescence from the single layer is confirmed. Such an organic luminescence device using a conjugated polymer has also been proposed by, e.g., U.S. Pat. Nos. 5,247,190, 5,514,878 and 5,672,678, JP-A 4-145192, and JP-A 5-247460.

As described above, recent progress in organic luminescence device is noticeable, and the resultant organic luminescence devices are characterized by high luminance (brightness) under application of a low voltage, various (light-)emission wavelengths, high-speed responsiveness, small thickness and light weight, thus suggesting possibility of wide applications.

However, the above-described organic aluminescence devices are still required to effect light output (emission) at a higher luminance and/or a higher conversion efficiency in the present state. These organic luminescence devices are also still insufficient in terms of durability such that the devices are liable to be changed in their properties with time when used for a long period or liable to be deteriorated by the influence of ambient air containing oxygen or of humidity. Further, in the case of using the organic luminescence devices for full-color display, it is necessary to effect luminescences of blue, green and red with good color purities. However, a satisfactory solution to the problem has not been realized yet, and particularly a red luminescence with a good color purity has not been satisfactorily provided.

On the other hand, spiro compounds having a unique three-dimensional structure and unique material properties have been noted as an organic functional material (J. Am. Chem. Soc. 110, p. 5687- (1988)). A proposal of using a spiro compound in an organic luminescence device has been reported (JP-A 7-278537) but has failed to provide an electron-transporting layer or a luminescence layer exhibiting sufficient luminescence performance.

SUMMARY OF THE INVENTION

A generic object of the present invention is to provide improvements to problems an mentioned above encountered in organic luminescence devices proposed heretofore.

A more specific object of the present invention is to provide an organic (electro-) luminescence device capable of effecting light output (emission) at high efficiency and luminance while realizing a prolonged life.

Another object of the present invention is to provide an organic luminescence device capable of providing a wide variety of emission wavelengths and emission hues, inclusive of particularly orange and red hues, and a good durability.

A further object of the present invention is to provide an organic luminescence device which can be produced easily and relatively inexpensively.

According to the present invention, there is provided an organic luminescence device, comprising: a pair of electrodes comprising an anode and a cathode, and a layer of organic compound disposed between the electrodes; wherein the organic compound layer contains at least one species of spiro compounds represented by formulae [I], [II] and [III] shown below:

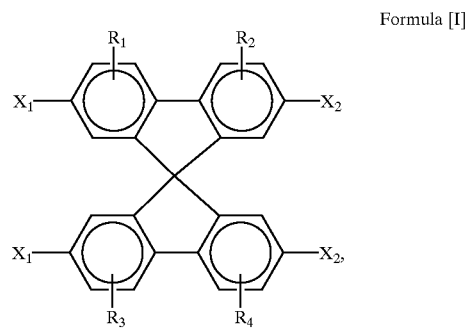

Formula [I]

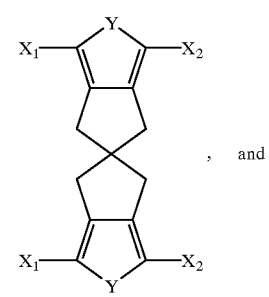

Formula [II]

, and

Formula [III]

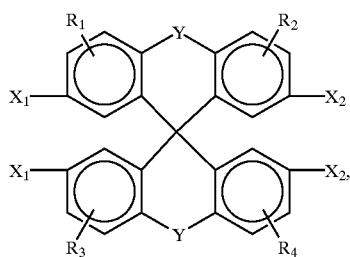

wherein $R_1$, $R_2$, $R_3$ and $R_4$ independently denote a hydrogen atom, an alkyl group, a substituted or unsubstituted aralkyl group, a substituted or unsubstituted aryl group, a substituted or unsubstituted heterocyclic group or a nitro group;

Y denotes —O—, —S—,

NR$_5$ or —CH=CH— wherein $R_5$ denotes a hydrogen atom, an alkyl group, a substituted or unsubstituted aralkyl group, a substituted or unsubstituted aryl group, or a substituted or unsubstituted heterocyclic group; and $X_1$ and $X_2$ independently denote a hydrogen atom, an alkyl group, a substituted or unsubstituted aralkyl group, a substituted or unsubstituted aryl group, a substituted or unsubstituted heterocyclic group, a nitro group, a substituted or unsubstituted amino group, or a group selected from those represented by structural formulae (IV)–(XIII) shown below with the proviso that at least one of $X_1$ and $X_2$ is selected from groups represented by the formulae (IV)–(XIII):

(IV)
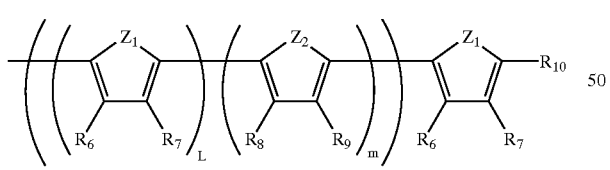

(V)
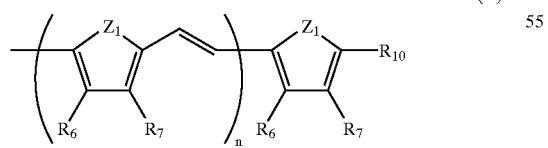

(VI)
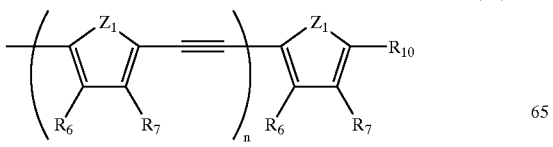

(VII)
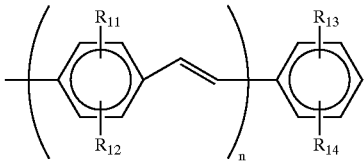

(VIII)
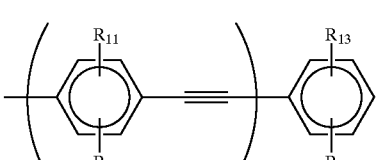

(IX)
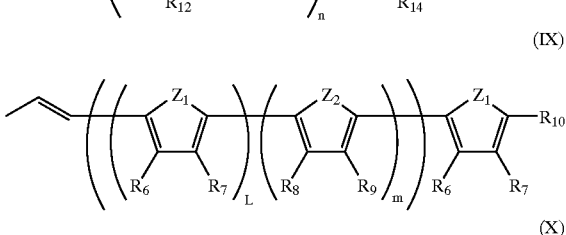

(X)
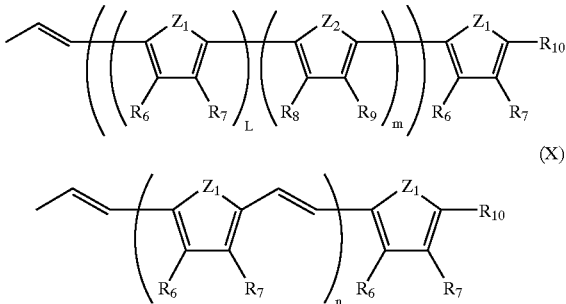

(XI)
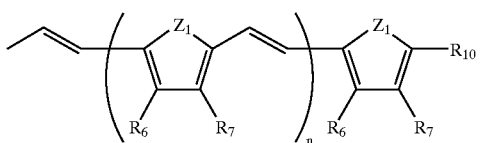

(XII)
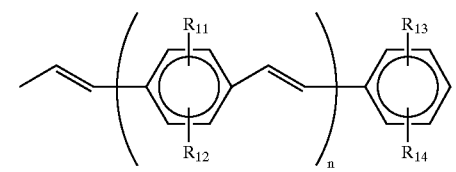

(XIII)
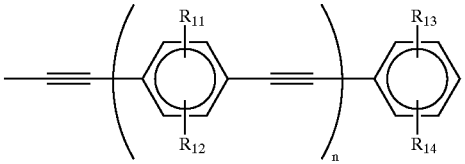

wherein $R_6$ to $R_{14}$ independently denote a hydrogen atom, an alkyl group, a substituted or unsubstituted aralkyl group, a substituted or unsubstituted aryl groups a substituted or unsubstituted heterocyclic group, an alkoxyl group, or a nitro group;

$Z_1$ and $Z_2$ independently denote —S—,

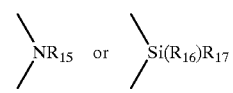

wherein $R_{15}$ denotes a hydrogen atom, an alkyl group, a substituted or unsubstituted aralkyl alkyl group, a substituted or unsubstituted aryl group or a substituted or unsubstituted heterocyclic group; $R_{16}$ and $R_{17}$ independently denote an alkyl group, a substituted or unsubstituted aralkyl group, a substituted or unsubstituted aryl group or a substituted or unsubstituted heterocyclic group; and L denotes an integer of 0–20, m denotes an integer of 0–20 with the proviso that L+m makes an integer of 1–20, and n is an integer of 1–20.

By using the spiro compound represented by the above-mentioned formula [I], [II] or [III] in the organic luminescence device, it becomes possible to effect luminescence at a very high luminance under application of a lower voltage and provide an excellent durability.

Particularly, the organic compound layer comprising the spiro compound of the formula [I], [II] or [III] used in the present invention is useful as an electron-transporting layer, and also as a luminscence layer.

Further, the organic compound layer can be prepared through vacuum deposition, casting, wet-coating, etc., thus readily realizing a larger size thereof relatively inexpensively.

These and other objects, features and advantages of the present invention will become more apparent upon a consideration of the following description of the preferred embodiments of the present invention taken in conjunction with the accompanying drawing.

DETAILED DESCRIPTION OF THE PREFERRED EMBODIMENTS

Figure 1:
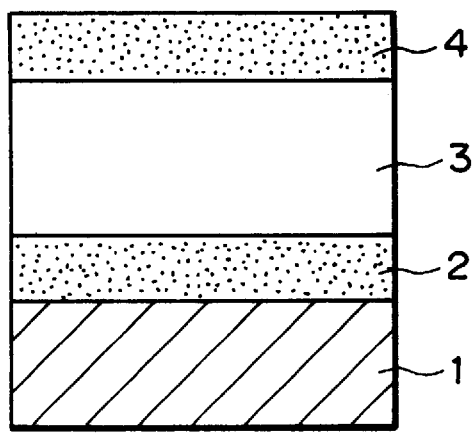
FIGS. 1 to 3 are schematic sectional views each illustrating a basic structure of an organic luminescence device according to an embodiment of the present invention.

The organic luminescence device according to the present invention is characterized in that the organic compound layer disposed between the pair of electrodes (anode and cathode) contains at least one species of spiro compounds represented by the above-mentioned formulae [I] to [III].

Specific examples of the substituents represented by $R_1$–$R_{17}$ and $X_1$ and $X_2$ in the above-mentioned formulae [I] to [III] and formulae (IV) to (XIII) are enumerated hereinbelow.

Specific examples of the alkyl group may include: methyl, ethyl, n-propyl, iso-propyl, n-butyl, tert-butyl, and octyl.

Specific examples of the aralkyl group may include: benzyl and phenethyl.

Specific examples of the aryl group may include: phenyl, biphenyl, terphenyl, naphthyl, anthryl and phenanthryl.

Specific examples of heterocyclic group may include: thienyl, pyrrolyl, imidazolyl, furyl, pyridyl, indolyl, quinolinyl, and carbazolyl.

Specific examples of the amino group may include: dimethylamino, diethylamino, dibenzylamino, and diphenylamino.

Specific examples of the alkoxyl group may include: methoxyl, ethoxyl, propoxyl, and phenoxyl.

Specific examples of the substituents which may be possessed by the above-mentioned substituents may include: alkyl groups, such as methyl, ethyl and propyl; aralkyl groups, such as benzyl and phenethyl; aryl groups, such as phenyl, nephthyl and anthryl; heterocyclic groups, such as thienyl, pyrrolyl, pyridyl and quinolinyl; and amino groups, such as dimethylamino, diethylamino, dibenzylamino and diphenylamino.

In view of the easiness of production and capability of providing a longer luminescent wavelength, it is preferred to use a spiro compound of the formula [I], [II] or [III] wherein both $X_1$ and $X_2$ are groups represented by any of the above-mentioned structural formulae (IV)–(XIII) and including a thiophene skeleton.

It is also preferred that L+m and n in the structural formulae (IV)–(XIII) are integers of 2-8.

It is preferred that the spiro compound of the formula [I], [II] or [III] is contained in a single luminescence layer constituting the organic compound layer, or more preferably in a luminescence layer and/or an electron-transporting layer constituting the organic compound layer of a laminated structure for achieving better luminescence performances in a longer wavelength region.

Specific examples of the spiro compounds of the formulae [I]. [II] and [III] are enumerated hereinafter separately for the respective formulae wherein some representative structures for the groups $X_1$ and $X_2$ are identified by symbols A-1 to A-45 (i.e., Example groups A-1 to A-45) shown below.

Incidentally, the spiro compounds used in the present invention inclusive of those enumerated below are synthesized by, e.g., a method as reported by James M, Tour; Journal of Organic Chemistry, Vol. 61, pp. 6906- (1996).

[Structural Examples for the Groups $X_1$ and $X_2$]

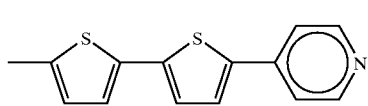

A-1

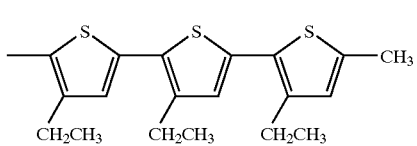

A-2

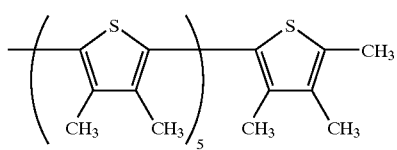

A-3

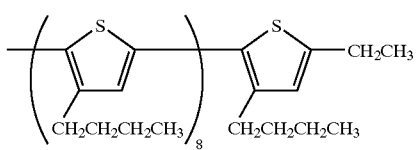

A-4

-continued
A-5
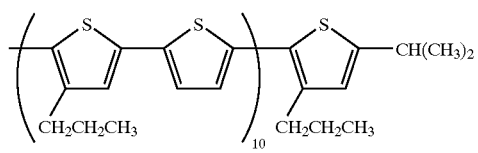
A-6
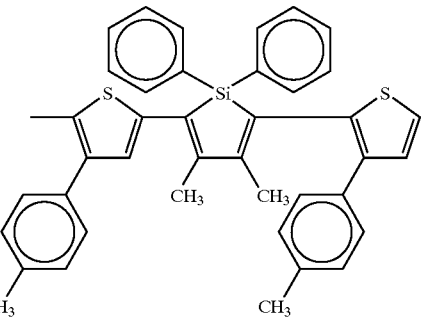
A-7
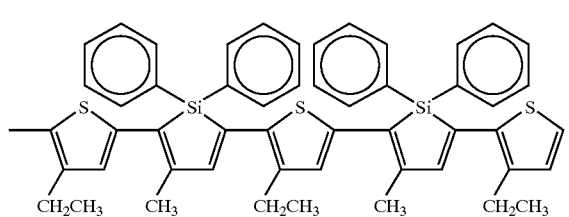
A-8
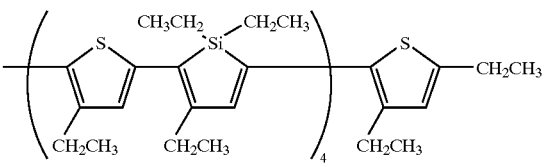
A-9
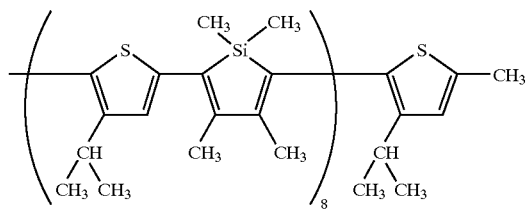
A-10
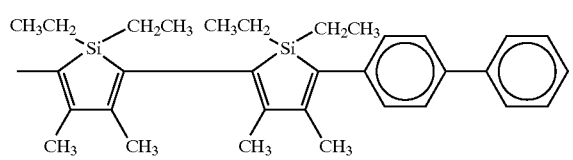
A-11
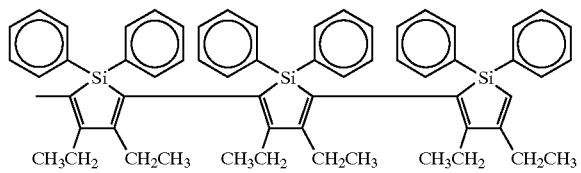
A-12
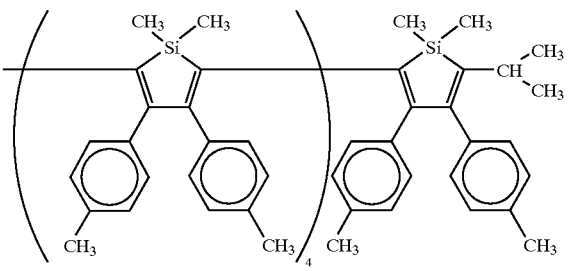
A-13
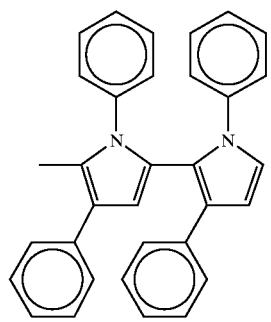
A-14
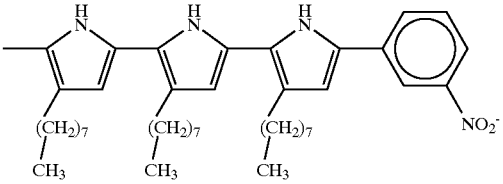
A-15
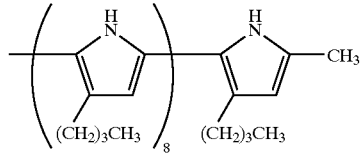
A-16
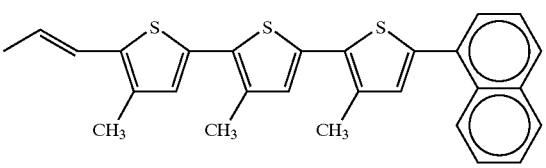

-continued
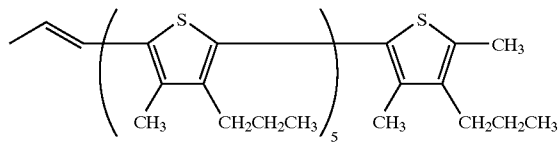
A-17
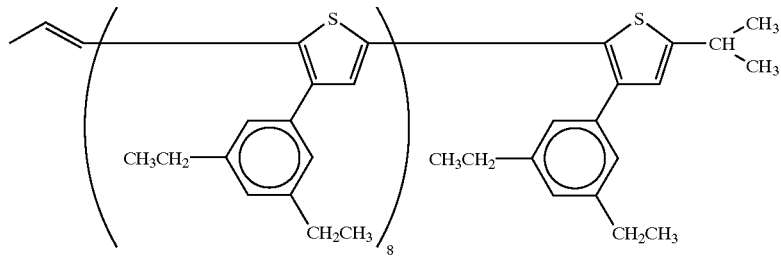
A-18
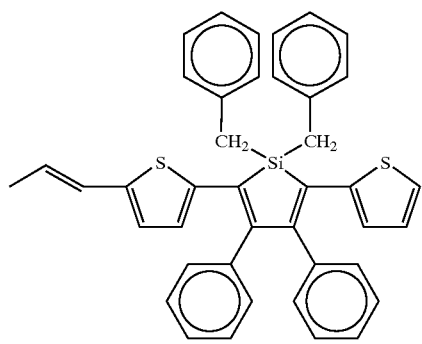
A-19
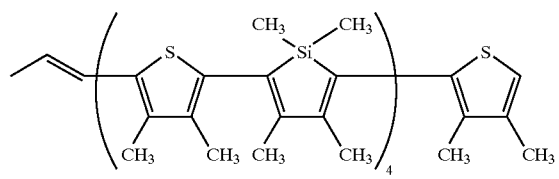
A-20
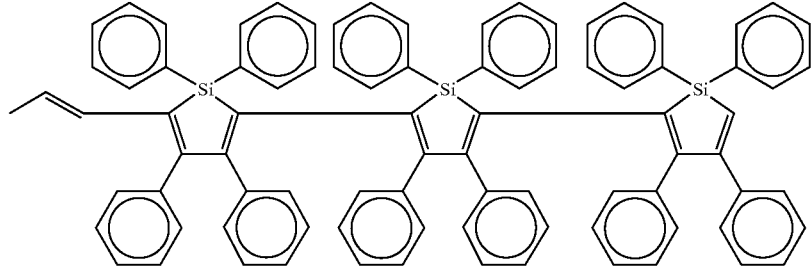
A-21
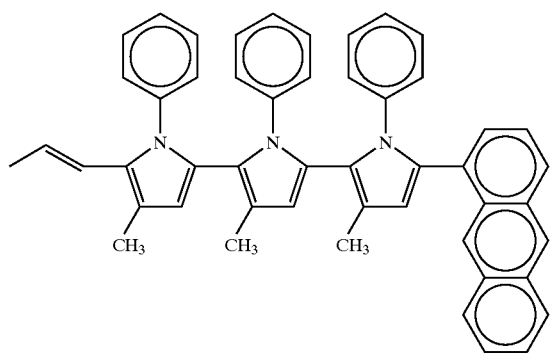
A-22
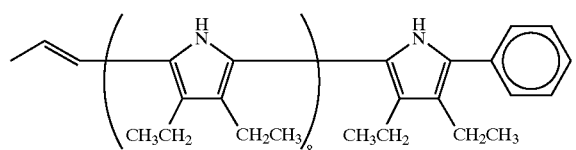
A-23

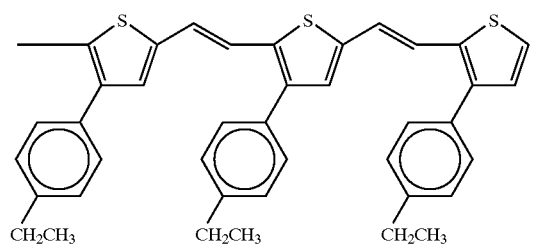
A-24
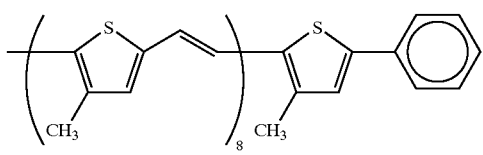
A-25
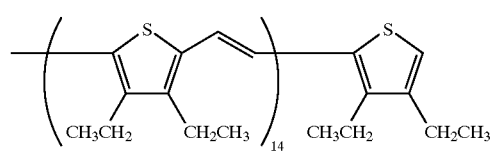
A-26
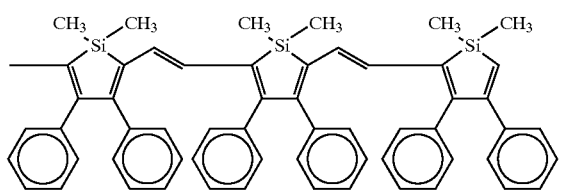
A-27
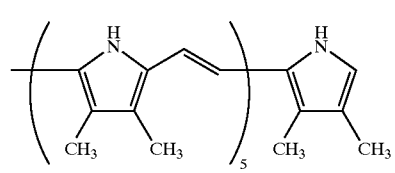
A-28
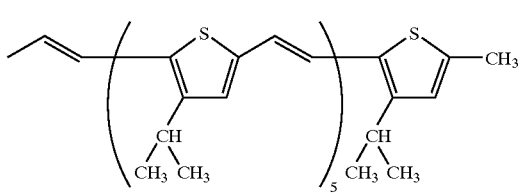
A-29
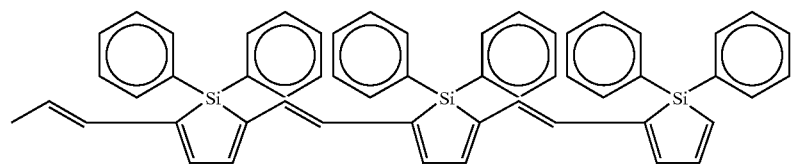
A-30
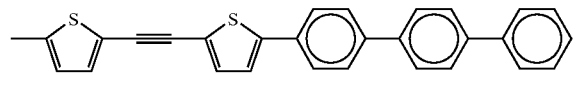
A-31
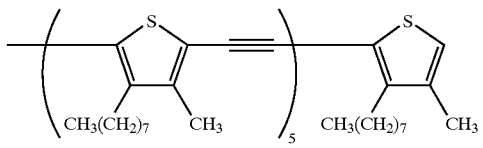
A-32
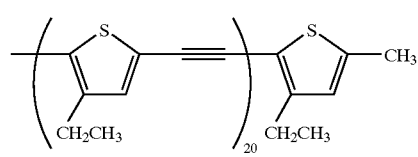
A-33
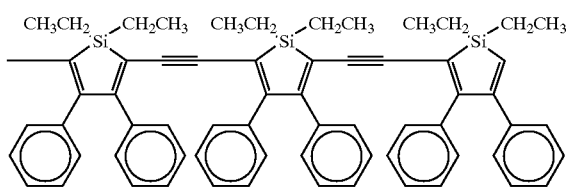
A-34
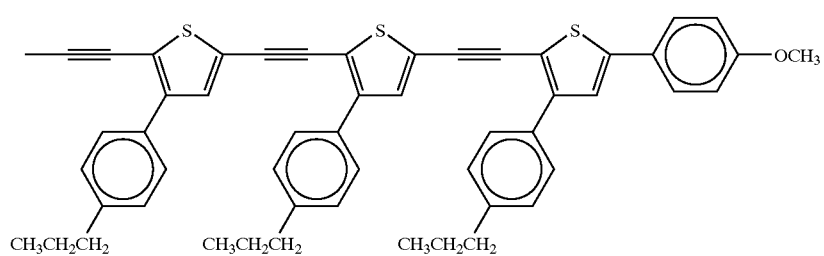
A-35

-continued
A-36
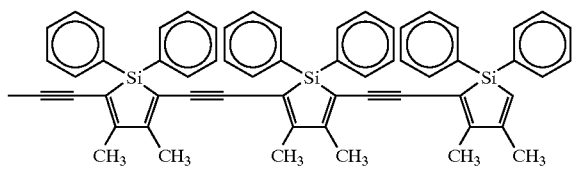
A-37
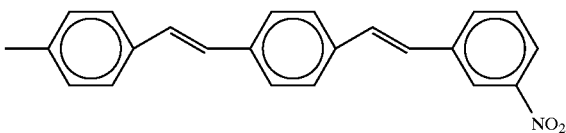
A-38
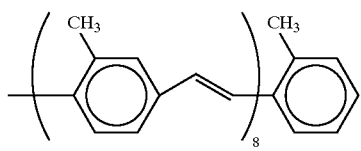
A-39
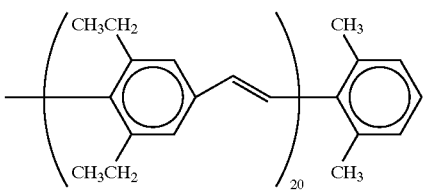
A-40
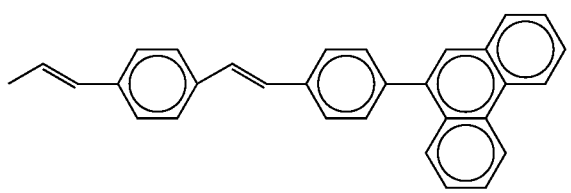
A-41
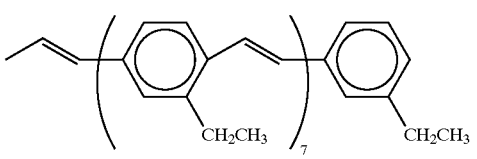
A-42
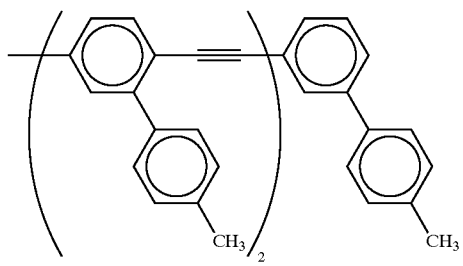
A-43
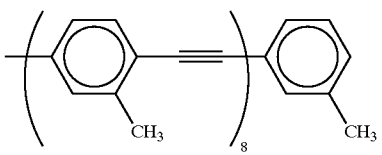
A-44
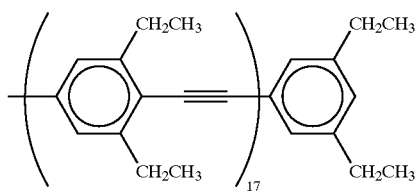
A-45
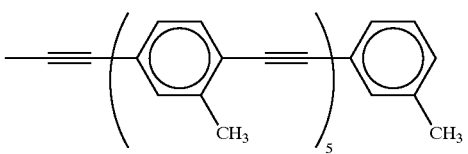

[Compound Examples]

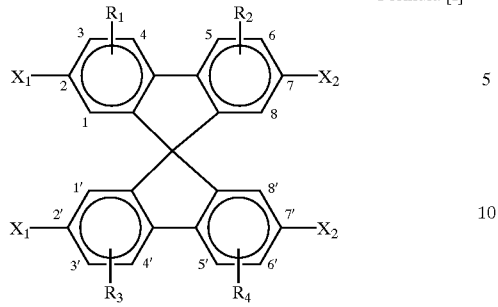

Formula [I]

Specific examples (Compounds Nos. I-1 to I-27) represented by Formula [I] above wherein substituent positions are indicated by numbers, are enumerated hereinbelow in Table 1 listing the examples of groups for $R_1$–$R_4$ and $X_1$ and $X_2$.

TABLE 1

| Compound No. | $R_1$ | $R_2$ | $R_3$ | $R_4$ | $X_1$ | $X_2$ |
|---|---|---|---|---|---|---|
| [I]-1 | H | H | H | H | —CH$_3$ | A-4 |
| [I]-2 | H | H | H | H | (phenyl) | A-15 |
| [I]-3 | H | H | H | H | (diphenylamino) | A-20 |
| [I]-4 | H | H | H | H | A-2 | A-2 |
| [I]-5 | H | H | H | H | A-3 | A-3 |
| [I]-6 | H | H | H | H | A-4 | A-4 |
| [I]-7 | H | H | H | H | A-6 | A-6 |
| [I]-8 | H | H | H | H | A-7 | A-7 |
| [I]-9 | 4-CH$_3$ | 5-CH$_3$ | 4'-CH$_3$ | 5'-CH$_3$ | A-9 | A-9 |
| [I]-10 | H | H | H | H | A-11 | A-11 |
| [I]-11 | H | H | H | H | A-15 | A-15 |
| [I]-12 | H | H | H | H | A-18 | A-18 |
| [I]-13 | H | H | H | H | A-21 | A-21 |
| [I]-14 | H | H | H | H | A-23 | A-23 |
| [I]-15 | H | H | H | H | A-26 | A-26 |
| [I]-16 | H | H | H | H | A-27 | A-27 |
| [I]-17 | H | H | H | H | A-32 | A-32 |
| [I]-18 | H | H | H | H | A-34 | A-34 |
| [I]-19 | H | H | H | H | A-35 | A-35 |
| [I]-20 | H | H | H | H | A-38 | A-38 |
| [I]-21 | H | H | H | H | A-40 | A-40 |
| [I]-22 | 3-(phenyl) | 6-(phenyl) | 3'-(phenyl) | 6'-(phenyl) | A-42 | A-42 |
| [I]-23 | H | H | H | H | A-43 | A-43 |
| [I]-24 | H | H | H | H | A-45 | A-45 |
| [I]-25 | H | H | H | H | A-5 | A-8 |
| [I]-26 | H | H | H | H | A-2 | A-14 |
| [I]-27 | H | H | H | H | A-31 | A-41 |

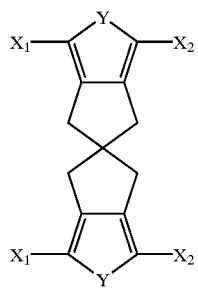

Formula [II]

Specific examples (Compounds Nos. II-1 to II-33) represented by Formula [II] above, are enumerated in Table 2 below listing the examples of groups for X$_1$ and X$_2$.

TABLE 2

| Compound No. | Y | X$_1$ | X$_2$ |
|---|---|---|---|
| [II]-1 | —O— | —CH$_2$—C$_6$H$_5$ | A-3 |
| [II]-2 | —O— | A-3 | A-3 |
| [II]-3 | —O— | A-8 | A-8 |
| [II]-4 | —O— | A-14 | A-14 |
| [II]-5 | —O— | A-19 | A-19 |
| [II]-6 | —O— | A-25 | A-25 |
| [II]-7 | —O— | A-31 | A-31 |
| [II]-8 | —O— | A-41 | A-41 |
| [II]-9 | —S— | A-1 | A-1 |
| [II]-10 | —S— | A-2 | A-2 |
| [II]-11 | —S— | A-7 | A-7 |
| [II]-12 | —S— | A-13 | A-13 |
| [II]-13 | —S— | A-17 | A-17 |
| [II]-14 | —S— | A-22 | A-22 |
| [II]-15 | —S— | A-29 | A-29 |
| [II]-16 | —S— | A-36 | A-36 |
| [II]-17 | —S— | A-39 | A-39 |
| [II]-18 | —S— | A-45 | A-45 |
| [II]-19 | —S— | A-1 | A-11 |
| [II]-20 | —S— | A-2 | A-6 |
| [II]-21 | —NH— | A-4 | A-4 |
| [II]-22 | —NH— | A-10 | A-10 |
| [II]-23 | —NH— | A-12 | A-12 |
| [II]-24 | —NH— | A-16 | A-16 |
| [II]-25 | —NH— | A-20 | A-20 |
| [II]-26 | —N(C$_6$H$_5$)— | A-24 | A-24 |
| [II]-27 | —NH— | A-28 | A-28 |
| [II]-28 | —N(CH$_3$)— | A-30 | A-30 |
| [II]-29 | —NH— | A-44 | A-44 |
| [II]-30 | —CH=CH— | A-2 | A-2 |
| [II]-31 | —CH=CH— | A-17 | A-17 |
| [II]-32 | —CH=CH— | A-38 | A-38 |
| [II]-33 | —CH=CH— | A-43 | A-43 |

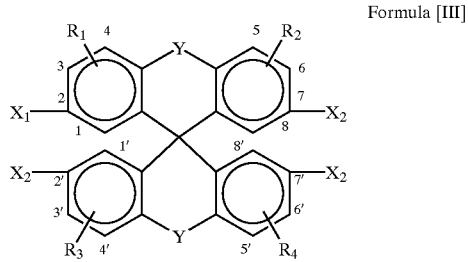

Formula [III]

Specific examples (Compounds Nos. III-1 to III-11) represented by Formula [III] above wherein substituent positions are indicated by numbers, are enumerated hereinbelow in Table 3 listing the examples of groups for R$_1$–R$_4$ and X$_1$ and X$_2$.

TABLE 3

| Compound No. | R$_1$ | R$_2$ | R$_3$ | R$_4$ | Y | X$_1$ | X$_2$ |
|---|---|---|---|---|---|---|---|
| [III]-1 | H | H | H | H | —O— | —NO$_2$ | A-3 |
| [III]-2 | H | H | H | H | —O— | A-4 | A-4 |
| [III]-3 | H | H | H | H | —S— | A-2 | A-2 |
| [III]-4 | H | H | H | H | —S— | A-8 | A-8 |
| [III]-5 | H | H | H | H | —S— | A-21 | A-21 |
| [III]-6 | H | H | H | H | —S— | A-37 | A-37 |
| [III]-7 | H | H | H | H | —NH— | A-14 | A-14 |
| [III]-8 | H | H | H | H | —NH— | A-28 | A-28 |
| [III]-9 | H | H | H | H | —N(CH$_3$)— | A-33 | A-33 |
| [III]-10 | 3-CH$_3$ | 6-CH$_3$ | 3'-CH$_3$ | 6'-CH$_3$ | —CH=CH— | A-27 | A-27 |
| [III]-11 | H | H | H | H | —CH=CH— | A-45 | A-45 |

In the organic luminescence device of the present invention, the organic compound layer comprising the above-mentioned spiro compound of the formula [I], [II] or [III] may be formed between the pair of anode and cathode (electrodes) by vacuum deposition or wet-coating process. The organic compound layer may preferably be formed in a thickness of at most 10 μm, more preferably at most 0.5 μm, further preferably 0.01–0.5 μm.

Figure 2:
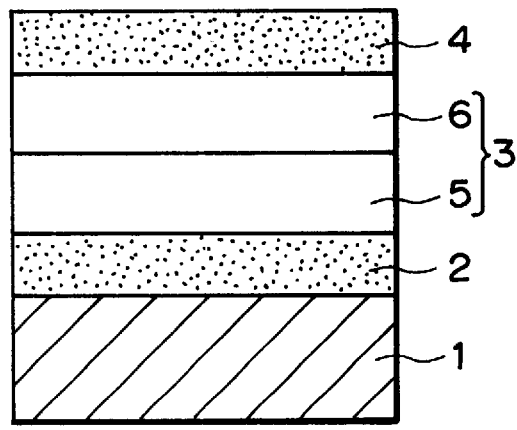
Figure 3:
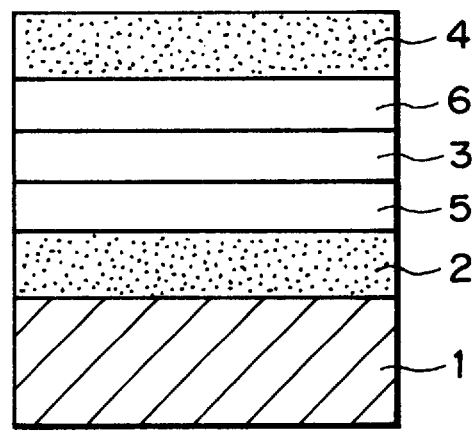

The organic compound layer constituting the organic luminescence device of the present invention may have a single-layer structure as shown in FIG. 1 or a laminate structure of two or more layers as shown in FIGS. 2 and 3.

More specifically, FIG. 1 is a schematic sectional view illustrating an embodiment of the organic luminescence device of the present invention. Referring to FIG. 1, the organic luminescence device includes a substrate 1, and an anode 2, a luminescence layer 3 and a cathode disposed in this order on the substrate 1 so as to form a laminate structure. The luminescence layer 3 may comprise a single species of luminescent material exhibiting a hole-transporting function, an electron-transporting function and a luminescence function in combination or a mixture of plural compounds exhibiting these functions, respectively. The luminescence layer 3 may have a thickness of 5 nm to 1 μm, preferably 10–500 nm.

FIG. 2 is a sectional view showing a laminate structure of another embodiment of the organic luminescence device. Referring to FIG. 2, the organic luminescence device includes a substrate 1, and an anode 2, a hole-transporting layer 5, an electron-transporting layer 6 and a cathode 4 disposed successively in this order on the substrate 1 so as to form a laminate structure, either one or both of the hole-transporting layer 5 and the electron-transporting layer 6 may contain a luminescent material also having a hole-transporting function and/or an electron-transporting function, respectively, for constituting a luminescence layer 3 in combination. One of the layers 6 and 5 may contain a material having no luminescent function but having a good electron-transporting or hole-transporting function. Each of the hole-transporting layer 5 and the electron-transporting layer 6 may have a thickness of 5 nm to 1 μm, preferably 10–500 nm.

FIG. 3 is a sectional view showing still another embodiment of the organic luminescence device of the present invention. Referring to FIG. 3, the organic luminescence device includes a substrate 1, and an anode 2, a hole-transporting layer 5, a luminescence layer 3, an electron-transporting layer 6 and a cathode 4 disposed successively in this order on the substrate 1 to form a laminate structure. In this embodiment, the carrier transporting functions and the luminescent function of the organic compound layer are separated and assigned to the respective layers. Each of the hole-transporting layer 5, the luminescence layer 3 and the electron-transporting layer 6 may contain a single species or plural species of compounds showing respectively expected functions so as to exhibit desired performances. More specifically, in the case of using plural species of compounds in combination, a lot of latitude is provided in selection of materials for each layer, and various compounds having different emission wavelengths can be used to provide a variety of luminescence hues.

Further, as the carriers and excitons are effectively confined in the central luminescence layer 3, it is possible to increase the luminescence efficiency.

In the embodiment of FIG. 3, each of the hole-transporting layer 5, the luminescence layer 3 and the electron-transporting layer 6 may have a thickness of 5 nm -1 μm, preferably 10–500 nm.

It is to be understood however that FIGS. 1–3 described above merely show basic structures of the organic luminescence device according to the present invention, and various modifications thereof are possible. For example, between the organic compound layer(s) and the electrodes (anode and cathode), it is possible to dispose an electron injection layer (on the cathode side), a hole injection layer (on the anode side), an insulating layer, an adhesive layer, or an interference layer. Further, the hole-transporting layer 5 can be divided into two layers with different ionization potentials.

The spiro compound represented by the formula [I], [II] or [III] have better electron-transporting performance, luminescence performance and durability than conventional compounds and can be adopted in any of the device structures shown in FIGS. 1 to 3.

The organic compound layer containing the spiro compound is particularly useful as an electron-transporting layer and/or a luminescence layer. A layer thereof may be formed by vacuum deposition or solution coating in a form which is not liable to crystallize and is excellent in stability with time.

In the present invention, the spiro compound of the formula [I], [II] or [III] can be used to constitute an electron-transporting layer and/or a luminescence layer, as desired, in combination with a known hole-transporting compound, luminescent compound or electron-transporting compound, examples of which are enumerated hereinbelow.

[Hole-transporting compounds (low-molecular weight)]

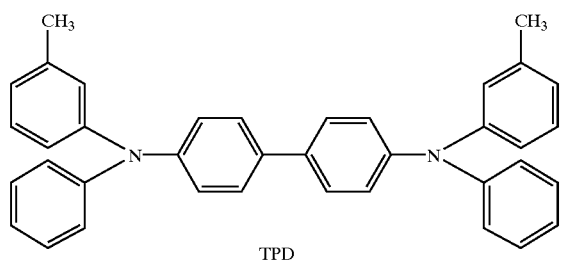

TPD

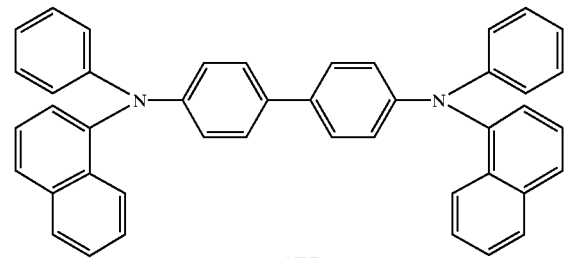

a-NPD

-continued
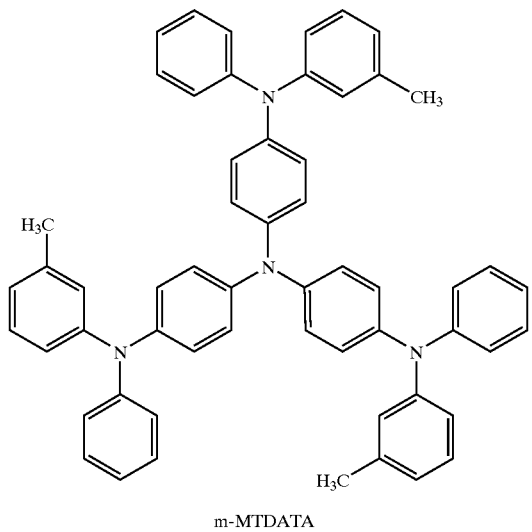
m-MTDATA
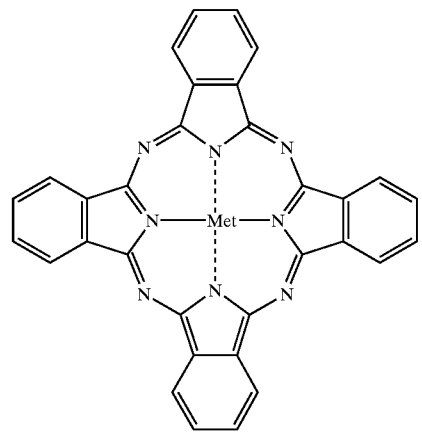
Met = Cu, Mg, AlCl, TiO$_2$, SiCl$_2$, etc.
Met-Pc
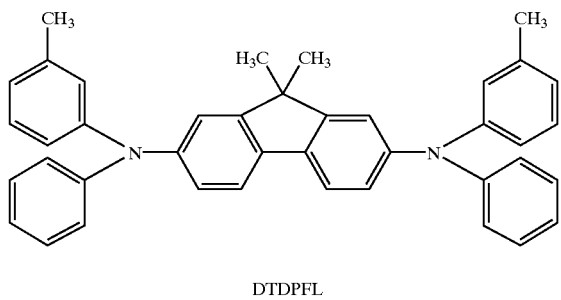
DTDPFL
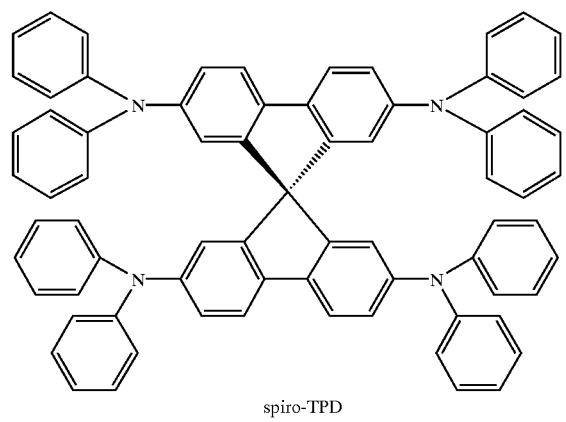
spiro-TPD
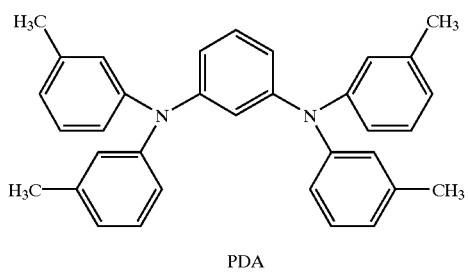
PDA
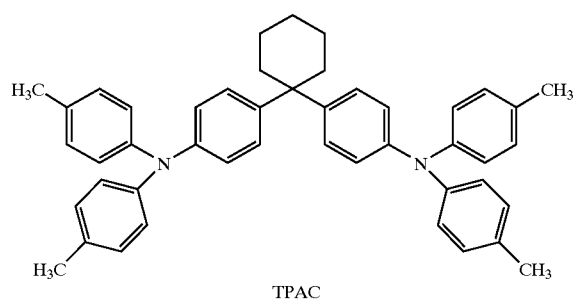
TPAC -continued
[Hole-transporting material (polymeric)]
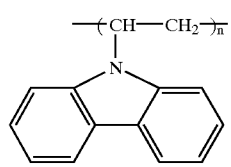
PVCz
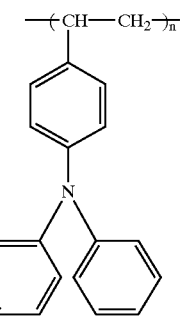
DPA-PS
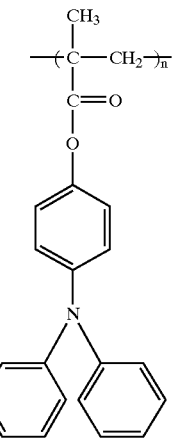
TPA-PMMA
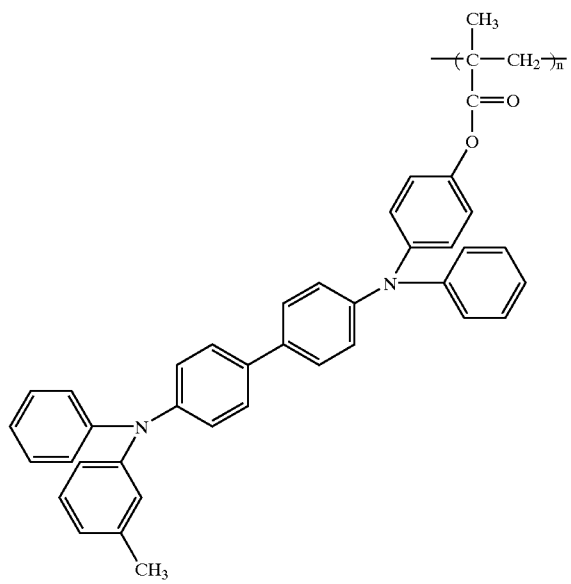
TPD-PMMA
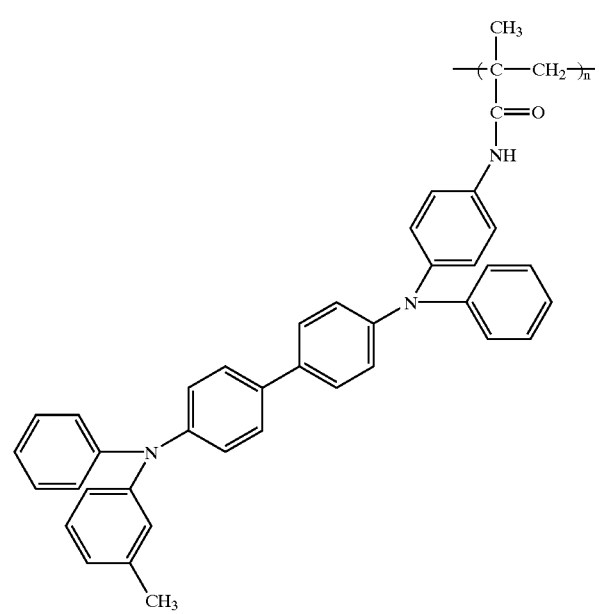
TPD-PMAA
[Hole-material compounds (polymeric)]
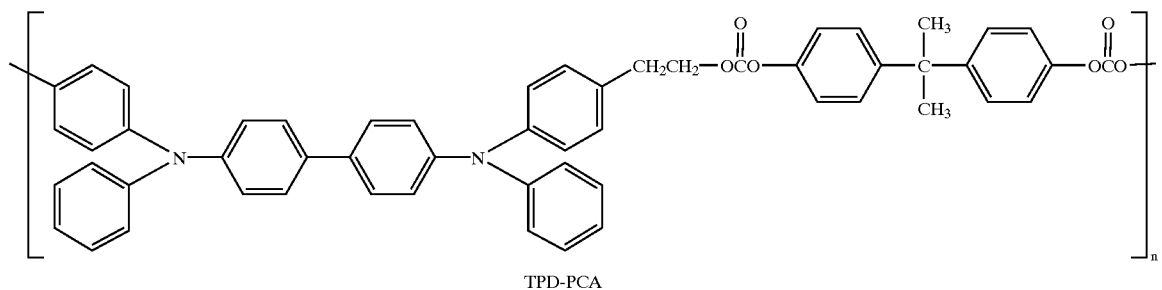
TPD-PCA

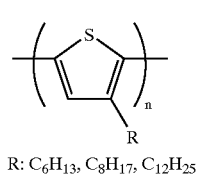
R: $C_6H_{13}$, $C_8H_{17}$, $C_{12}H_{25}$
Poly thiophene
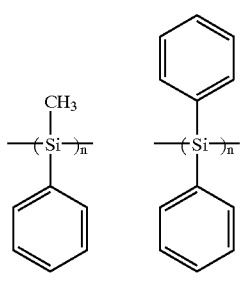
Poly silicone
[Electron-transporting (luminescent) materials]
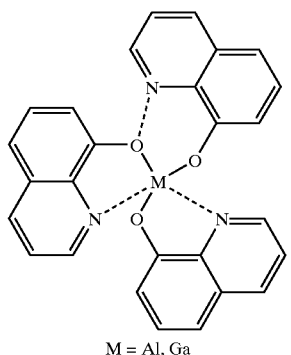
M = Al, Ga
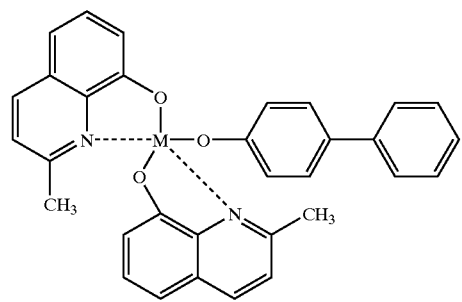
M = Al, Ga
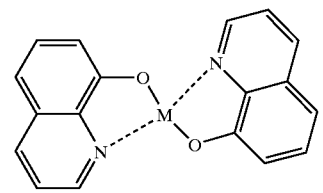
M = Zn, Mg, Be
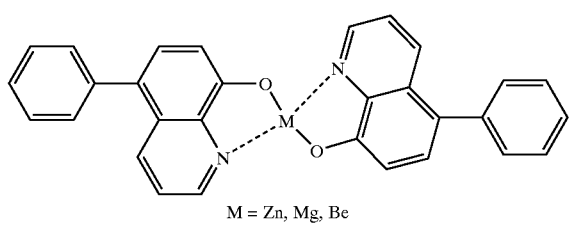
M = Zn, Mg, Be
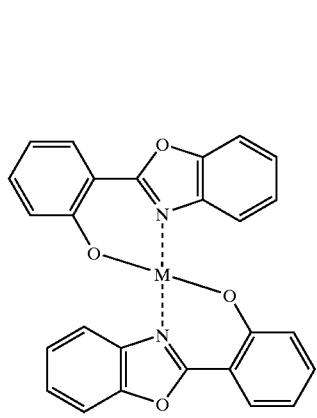
M = Zn, Mg, Be
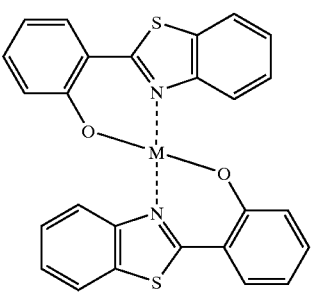
M = Zn, Mg, Be
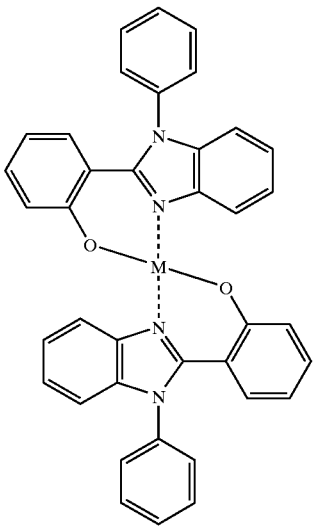
M = Zn, Mg, Be

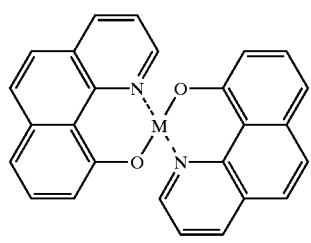
M = Zn, Mg, Be
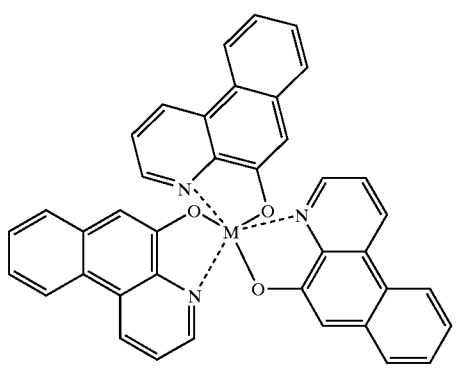
M = Al, Ga
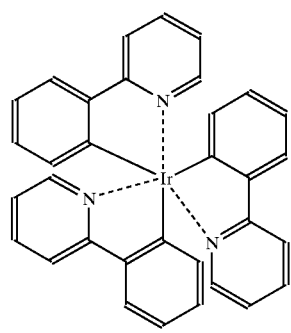
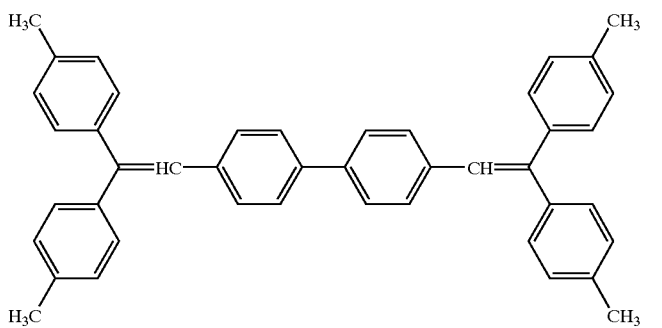
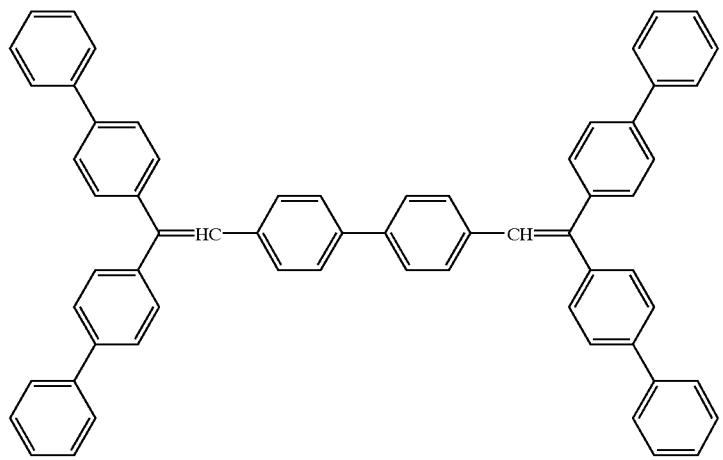
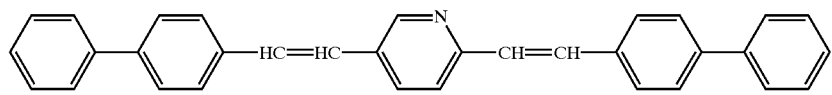
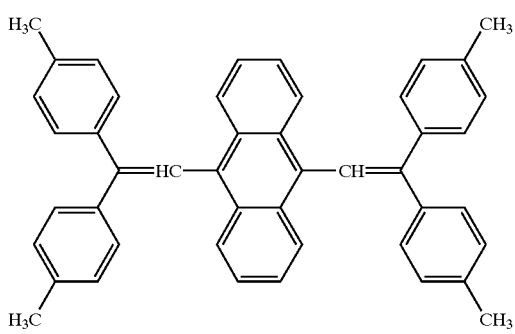
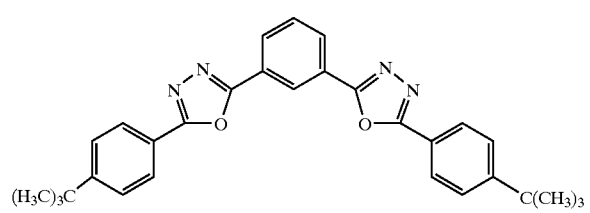

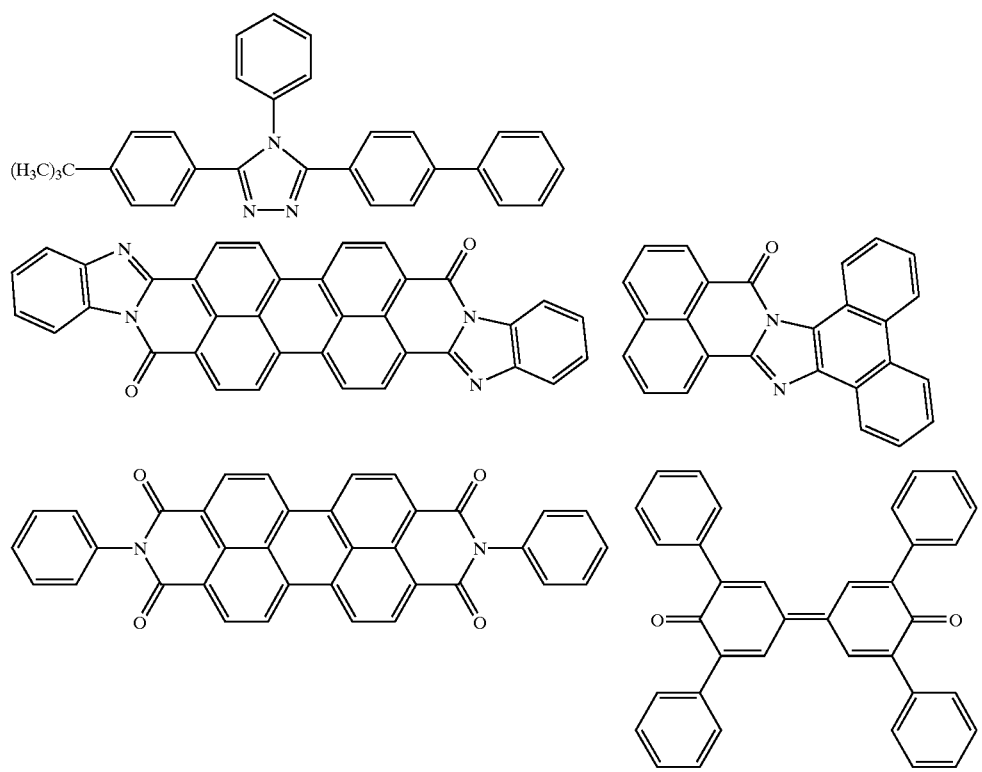
[Polymeric luminescent materials]
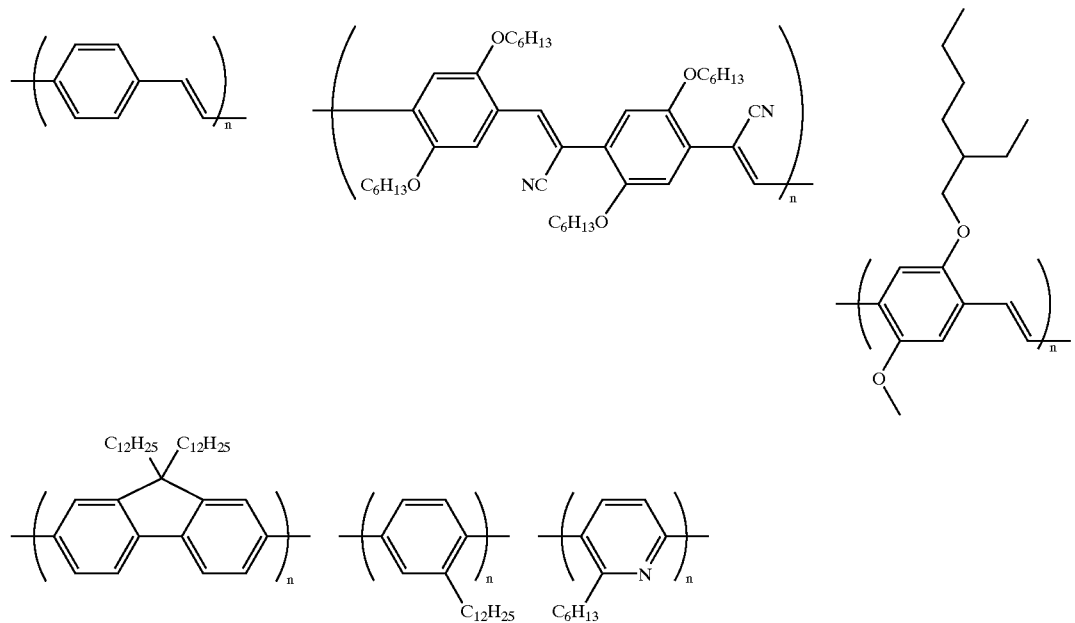

-continued
[Dopant]

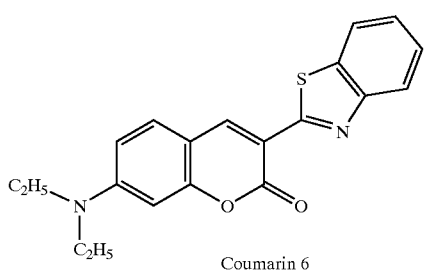
Coumarin 6

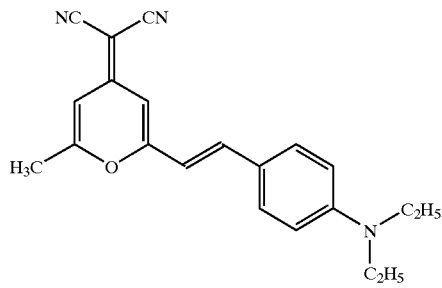
DCM-1

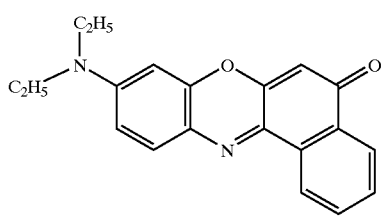
Nile red

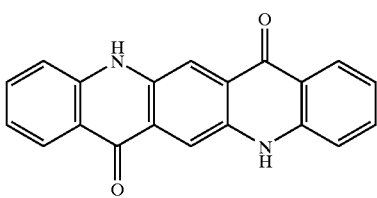
Quinacridone

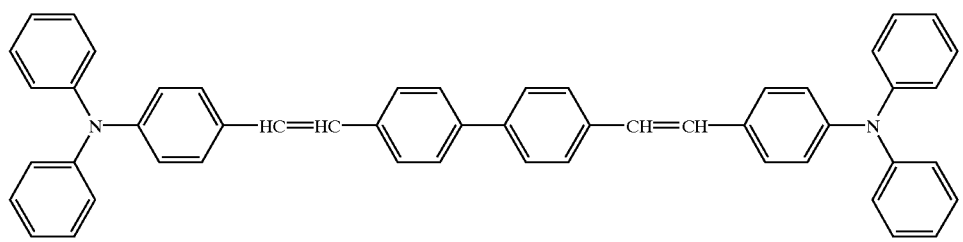
DTPABVi

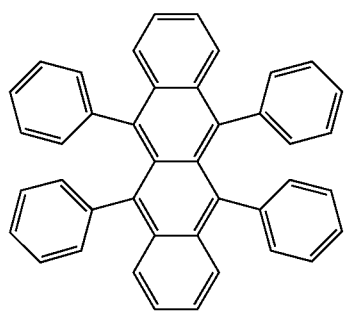
Rubrene

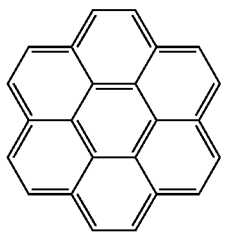
Coronene

As mentioned above, the organic compound layer containing the spiro compound of the formula [I], [II] or [III] or other organic compound layers may be formed into film by vacuum deposition or coating of a solution of the relevant compound in an appropriate solvent. In the case of the solution coating, the organic compound can be used in mixture with an appropriate binder resin to form a film. In this case, the organic compound, inclusive of the spiro compound of the formula [I], [II] or [III], may for example be used in 0.1–10 wt. parts per 100 wt. parts of the binder resin.

The binder resin used for the above purpose may be selected from a wide variety of scope. Examples thereof may include: polyvinyl carbazole resin, polycarbonate resin, polyester resin, polyarylate resin, polystyrene resin, acrylic resin, methacrylic resin, butyral resin, polyvinyl acetal resin, diallyl phthalate resin, phenolic resin, epoxy resin, silicone resin, polysulfone resin, and urea resin. These resins may be used singly or in combination of two or more species or in the form of copolymers.

As a material for the anode (2 shown in FIGS. 1–3), it is preferred to use one having as large a work function as possible, examples of which may include: metals, such as gold, platinum, nickel, palladium, cobalt, selenium and vanadium, and their alloys; metal oxides, such as tin oxide, zinc oxide, indium tin oxide (ITO), and indium zinc oxide; and electroconductive polymers, such as polyaniline, polypyrrole, polythiophene, and polyphenylene sulfide. These compounds may be used singly or in combination of two or more species.

On the other hand, as a material for the cathode 4 shown in FIGS. 1–3, it is preferred to use one having a small work function, examples of which may include: metals, such as lithium, sodium, potassium, calcium, magnesium, aluminum, indium, silver, lead, tin and chromium, and their alloys. It is also possible to use metal oxide, such as indium tin oxide (ITO). The cathode may be formed in a single layer or a lamination of plural layers.

The substrate 1 shown in FIGS. 1–3 for the organic luminescence device of the present invention may include an opaque substrate of metal, ceramics, etc., and a transparent substrate of glass, quartz, plastics, etc. It is possible to form the substrate with a color filter film, a fluorescent color conversion film, a dielectric reflection film, etc., thus controlling emitted luminescent light.

In order to prevent contact with oxygen and/or moisture, the organic luminescence device of the present invention may further include a protective layer or a sealing layer. Examples of the protective layer may include: an inorganic film of diamond, metal oxide, metal nitride, etc.; a polymer film of fluorine-containing resin, polyparaxylene, polyethylene, silicone resin, polystyrene, etc., and a film of light-curable resin. It is also possible to effect packaging of the organic luminescence device per se with a sealing resin while covering the organic luminescence device with glass, gas-impermeable film, metal, etc.

Hereinbelow, the present invention will be described more specifically based on Examples.

EXAMPLE 1

An electroluminescence device of a structure as shown in FIG. 2 was prepared in the following manner.

A 1.1 mm-thick glass substrate coated with a 120 nm-thick film of ITO (indium tin oxide) formed by sputtering was successively washed with acetone and isopropyl alcohol (IPA) under application of ultrasonic wave and then washed with IPA under boiling, followed by cleaning by UV/ozone (i.e., irradiation with ultraviolet rays in the ozone-containing atmosphere), to obtain a transparent conductive substrate (including a substrate 1 and an ITO anode 2 formed thereon).

The transparent conductive substrate was coated by vacuum deposition of a compound (TPD) represented by a structural formula shown below:

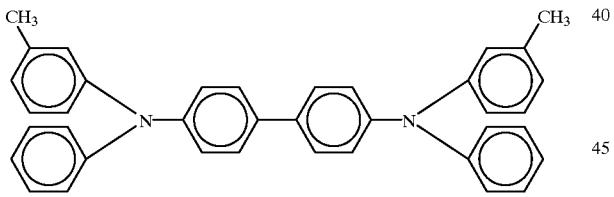

to form a 60 nm-thick hole-transporting layer 5 and then by vacuum deposition of a spiro compound (Compound No. I-4 listed in Table 1) to form a 60 nm-thick electron-transporting layer 6. The vacuum deposition was respectively performed in a vacuum of $1.0 \times 10^{-4}$ Pa and at a film thickness growth rate of 0.2–0.3 nm/sec.

Then, the electron-transporting layer was further coated by vacuum deposition of Al—Li alloy (Li content: 1 atom %) to form a 150 nm-thick metal film 4 under a vacuum of $1.0 \times 10^{-4}$ Pa and at a film thickness growth rate of 1.0–1.2 nm/sec, thereby forming an organic luminescence device of a structure shown in FIG. 2.

The thus-obtained device was then supplied with a DC voltage of 8 volts between the ITO electrode 2 as an anode and the Al—Li alloy electrode as a cathods, whereby a current flowed at a density of 8.2 mA/cm$^2$ and red luminescence was observed at a luminance of 550 cd/m$^2$. The device was further subjected to 100 hours of continuous voltage application at a constant current density of 7.0 mA/cm$^2$ in a nitrogen atmosphere, whereby the device initially exhibited a luminance of 505 cd/m$^2$, which was lowered to 460 cd/m$^2$ after 100 hours, thus showing only a small luminance deterioration.

EXAMPLES 2–20

Organic luminescence devices were prepared and evaluated in the same manner as in Example 1 except for replacing the spiro compound of Compound No. I-4 with Compounds Nos. I-6, I-7, I-10, I-13, I-21, I-25, II-1, II-5, II-7, II-10, II-12, II-15, II-23, II-28, II-33, III-4, III-7, III-9 and III-11, respectively, listed in Tables 1 to 3 set forth above.

The results are inclusively shown in Table 4 set forth hereinafter.

COMPARATIVE EXAMPLES 1–3

Comparative organic luminescence devices were prepared and evaluated in the same manner as in Example 1 except for using Comparative Compound Nos. 1–3, respectively, shown below, instead of Compound No. I-4. The results are also shown in Table 4.

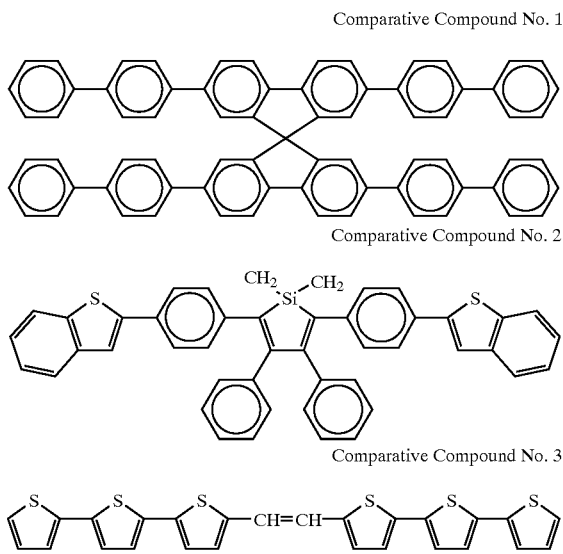

TABLE 4

| | | Initial | | Luminance (at 7.0 mA/cm$^2$) | |
|---|---|---|---|---|---|
| Example | Compound No. | Voltage (V) | Luminance (cd/m$^2$) | Initial (cd/m$^2$) | After 100 hrs. (cd/m$^2$) |
| 1 | I-4 | 8 | 550 | 505 | 460 |
| 2 | I-6 | 8 | 540 | 500 | 460 |
| 3 | I-7 | 8 | 355 | 310 | 280 |
| 4 | I-10 | 8 | 340 | 290 | 260 |
| 5 | I-13 | 8 | 200 | 170 | 145 |
| 6 | I-21 | 8 | 165 | 140 | 115 |
| 7 | I-25 | 8 | 310 | 270 | 235 |
| 8 | II-1 | 8 | 170 | 130 | 110 |
| 9 | II-5 | 8 | 200 | 165 | 135 |
| 10 | II-7 | 8 | 170 | 130 | 105 |
| 11 | II-10 | 8 | 590 | 540 | 485 |
| 12 | II-12 | 8 | 145 | 120 | 100 |
| 13 | II-15 | 8 | 350 | 310 | 275 |
| 14 | II-23 | 8 | 210 | 170 | 145 |
| 15 | II-28 | 8 | 160 | 130 | 105 |

TABLE 4-continued

| Example | Compound No. | Initial Voltage (V) | Initial Luminance (cd/m$^2$) | Luminance (at 7.0 mA/cm$^2$) Initial (cd/m$^2$) | Luminance (at 7.0 mA/cm$^2$) After 100 hrs. (cd/m$^2$) |
|---|---|---|---|---|---|
| 16 | II-33 | 8 | 140 | 120 | 90 |
| 17 | III-4 | 8 | 330 | 280 | 245 |
| 18 | III-7 | 8 | 150 | 120 | 95 |
| 19 | III-9 | 8 | 350 | 315 | 280 |
| 20 | III-11 | 8 | 170 | 135 | 110 |
| Comp. 1 | Comp. No. 1 | 8 | 45 | 40 | 10 |
| Comp. 2 | Comp. No. 2 | 8 | 80 | 55 | 20 |
| Comp. 3 | Comp. No. 3 | 8 | 25 | 20 | ** |

**: No luminescence

EXAMPLE 21

The procedure of Example 1 was repeated up to the formation of the hole-transporting layer 5.

Then, the hole-transporting layer 5 was further coated by vacuum deposition of a mixture of spiro compound (Compound No. I-1) and aluminum tris(quinolinol) in a weight ratio of 1:20 to form a 60 nm-thick electron-transporting layer 6 under a vacuum of $1.0 \times 10^{-4}$ Pa and at a film thickness growth rate of 0.2–0.3 nm/sec.

Then, the electron-transporting layer was further coated by vacuum deposition of Al—Li alloy (Li content: 1 atom. %) to form a 150 nm-thick metal film 4 under a vacuum of $1.0 \times 10^{-4}$ Pa and at a film thickness growth rate of 1.0–1.2 nm/sec, thereby forming an organic luminescence device of a structure shown in FIG. 2.

The thus-obtained device was then supplied with a DC voltage of 8 volts between the ITO electrode 2 as an anode and the Al—Li alloy electrode as a cathods, whereby a current flowed at a density of 8.7 mA/cm$^2$ and red luminescence was observed at a luminance of 540 cd/m$^2$. The device was further subjected to 100 hours of continuous voltage application at a constant current density of 7.0 mA/cm$^2$ in a nitrogen atmosphere, whereby the device initially exhibited a luminance of 500 cd/m$^2$, which was lowered to 360 cd/m$^2$ after 100 hours, thus showing only a small luminance deterioration.

EXAMPLES 22–32

Organic luminescence devices were prepared and evaluated in the same manner as in Example 21 except for replacing the spiro compound of Compound No. I-1 with Compounds Nos. I-8, I-11, I-16, I-23, II-2, II-9, II-16, II-20, III-2, III-6 and III-7, respectively, listed in Tables 1 to 3 set forth above.

The results are inclusively shown in Table 5 set forth hereinafter.

COMPARATIVE EXAMPLES 4–6

Comparative organic compound devices were prepared and evaluated in the same manner as in Example 21 except for using Comparative Compound Nos. 1–3, respectively, shown above, instead of Compound No. I-1. The results are also shown in Table 5.

TABLE 5

| Example | Compound No. | Initial Voltage (V) | Initial Luminance (cd/m$^2$) | Luminance (at 7.0 mA/cm$^2$) Initial (cd/m$^2$) | Luminance (at 7.0 mA/cm$^2$) After 100 hrs. (cd/m$^2$) |
|---|---|---|---|---|---|
| 21 | I-1 | 8 | 540 | 500 | 460 |
| 22 | I-8 | 8 | 760 | 715 | 660 |
| 23 | I-11 | 8 | 555 | 520 | 490 |
| 24 | I-16 | 8 | 565 | 530 | 495 |
| 25 | I-23 | 8 | 360 | 330 | 305 |
| 26 | II-2 | 8 | 745 | 700 | 670 |
| 27 | II-9 | 8 | 530 | 500 | 465 |
| 28 | II-16 | 8 | 545 | 510 | 475 |
| 29 | II-20 | 8 | 980 | 935 | 890 |
| 30 | III-2 | 8 | 1020 | 975 | 925 |
| 31 | III-6 | 8 | 530 | 500 | 455 |
| 32 | III-7 | 8 | 380 | 350 | 310 |
| Comp. 4 | Comp. No. 1 | 8 | 270 | 230 | 120 |
| Comp. 5 | Comp. No. 2 | 8 | 305 | 250 | 110 |
| Comp. 6 | Comp. No. 3 | 8 | 260 | 230 | 30 |

EXAMPLE 33

The procedure of Example 1 was repeated up to the formation of the hole-transporting layer 5.

Then, the hole-transporting layer 5 was further coated by vacuum deposition of aluminum tris(quinolinol) to form a 25 nm-thick luminescence layer 3 and then by vacuum deposition of a spiro compound (Compound No. I-5) to form a 40 nm-thick electron-transporting layer 6, respectively under a vacuum of $1.0 \times 10^{-4}$ Pa and at a film thickness growth rate of 0.2–0.3 nm/sec.

Then, the electron-transporting layer was further coated by vacuum deposition of Al—Li alloy (Li content: 1 atom. %) to form a 150 nm-thick metal film 4 under a vacuum of $1.0 \times 10^{-4}$ Pa and at a film thickness growth rate of 1.0–1.2 nm/sec, thereby forming an organic luminescence device of a structure shown in FIG. 3.

The thus-obtained device was then supplied with a DC voltage of 10 volts between the ITO electrode 2 as an anode and the Al—Li alloy electrode as a cathods, whereby a current flowed at a density of 12.3 mA/cm$^2$ and orange luminescence was observed at a luminance of 1470 cd/m$^2$. The device was further subjected to 100 hours of continuous voltage application at a constant current density of 10.0 mA/cm$^2$ in a nitrogen atmosphere, whereby the device initially exhibited a luminance of 1280 cd/m$^2$, which was lowered to 1200 cd/m$^2$ after 100 hours, thus showing only a small luminance deterioration.

EXAMPLES 34–45

Organic luminescence devices were prepared and evaluated in the same manner as in Example 33 except for replacing the Spiro compound of Compound No. I-5 with Compounds Nos. I-9, I-12, I-17, I-24, II-3, II-13, II-19, II-25, II-30, III-3, III-8 and III-10, respectively, listed in Tables 1 to 3 set forth above.

The results are inclusively shown in Table 6 set forth hereinafter.

COMPARATIVE EXAMPLES 7–9

Comparative organic luminescence devices were prepared and evaluated in the same manner as in Example 33 except for using Comparative Compound Nos. 1–3, respectively, shown above, instead of Compound No. I-5. The results are also shown in Table 6.

TABLE 6

| Example | Compound No. | Initial Voltage (V) | Initial Luminance (cd/m²) | Luminance (at 7.0 mA/cm²) Initial (cd/m²) | Luminance (at 7.0 mA/cm²) After 100 hrs. (cd/m²) |
|---|---|---|---|---|---|
| 33 | I-5 | 10 | 1470 | 1280 | 1200 |
| 34 | I-9 | 10 | 950 | 785 | 720 |
| 35 | I-12 | 10 | 1340 | 1160 | 1060 |
| 36 | I-17 | 10 | 940 | 780 | 730 |
| 37 | I-24 | 10 | 630 | 525 | 460 |
| 38 | II-3 | 10 | 930 | 765 | 710 |
| 39 | II-13 | 10 | 1280 | 1100 | 1010 |
| 40 | II-19 | 10 | 870 | 725 | 660 |
| 41 | II-25 | 10 | 960 | 820 | 730 |
| 42 | II-30 | 10 | 1450 | 1270 | 1170 |
| 43 | III-3 | 10 | 1540 | 1330 | 1220 |
| 44 | III-8 | 10 | 810 | 700 | 645 |
| 45 | III-10 | 10 | 860 | 720 | 640 |
| Comp. 7 | Comp. No. 1 | 10 | 130 | 100 | 35 |
| Comp. 8 | Comp. No. 2 | 10 | 160 | 125 | 40 |
| Comp. 9 | Comp. No. 3 | 10 | 55 | 40 | ** |

**: No luminescence.

EXAMPLE 46

A transparent conductive substrate prepared and treated for cleaning in the same manner as in Example 1 was coated with a solution of 0.050 g of a spiro compound (Compound No. I-4) and 1.00 g of poly-N-vinylcarbazole (weight-average molecular weight=63,000) in 80 ml of chloroform by spin coating at a rate of 2000 rpm, followed by drying, to form a 120 nm-thick organic layer (luminescence layer) 3.

Then, the luminescence layer was further coated by vacuum deposition of Al—Li alloy (Li content: 1 atom %) to form a 150 nm-thick metal film 4 under a vacuum of $1.0 \times 10^{-4}$ Pa and at a film thickness growth rate of 1.0–1.2 nm/sec, thereby forming an organic luminescence device of a structure shown in FIG. 1.

The thus-obtained device was then supplied with a DC voltage of 10 volts between the ITO electrode 2 as an anode and the Al—Li alloy electrode as a cathode, whereby a current flowed at a density of 9.3 mA/cm² and red luminescence was observed at a luminance of 350 cd/m².

COMPARATIVE EXAMPLE 10

An organic luminescence device was prepared in the same manner as in Example 46 except for using Comparative Compound No. 2 instead of Comparative Example No. I-4.

The resultant device was similarly supplied with a dc voltage of 10 volts, whereby a current followed at a density of 8.1 ma/cm² and yellow-green luminescence was observed at a luminance of 25 cd/m².

What is claimed is:

1. An organic luminescence device, comprising: a pair of electrodes comprising an anode and a cathode, and a layer of organic compound disposed between the electrodes; wherein the organic compound layer contains at least one species of spiro compounds represented by formulae [I], [II] and [III] shown below:

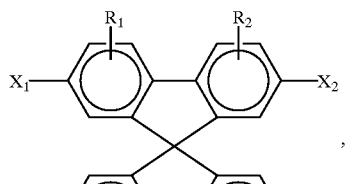

Formula [I]

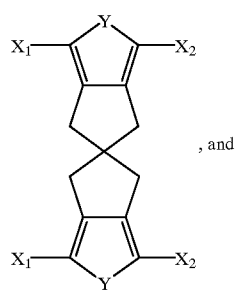

, and

Formula [II]

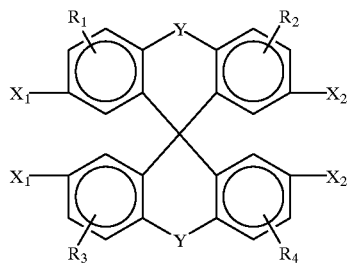

Formula [III]

wherein $R_1$, $R_2$, $R_3$ and $R_4$ independently denote a hydrogen atom, an alkyl group, a substituted or unsubstituted aralkyl group, a substituted or unsubstituted aryl group, a substituted or unsubstituted heterocyclic group or a nitro group;

Y denotes —O—, —S—,

or —CH═CH— wherein $R_5$ denotes a hydrogen atom, an alkyl group, a substituted or unsubstituted aralkyl group, a substituted or unsubstituted aryl group, or a substituted or unsubstituted heterocyclic group; and $X_1$ and $X_2$ independently denote a hydrogen atom, an alkyl group, a substituted or unsubstituted aralkyl group, a substituted or unsubstituted aryl group, a substituted or unsubstituted heterocyclic group, a nitro group, a substituted or unsubstituted amino group, or a group selected from those represented by structural formulae (IV)–(XIII) shown below with the proviso that at least one of $X_1$ and $X_2$ is selected from groups represented by the formulae (IV)–(XIII):

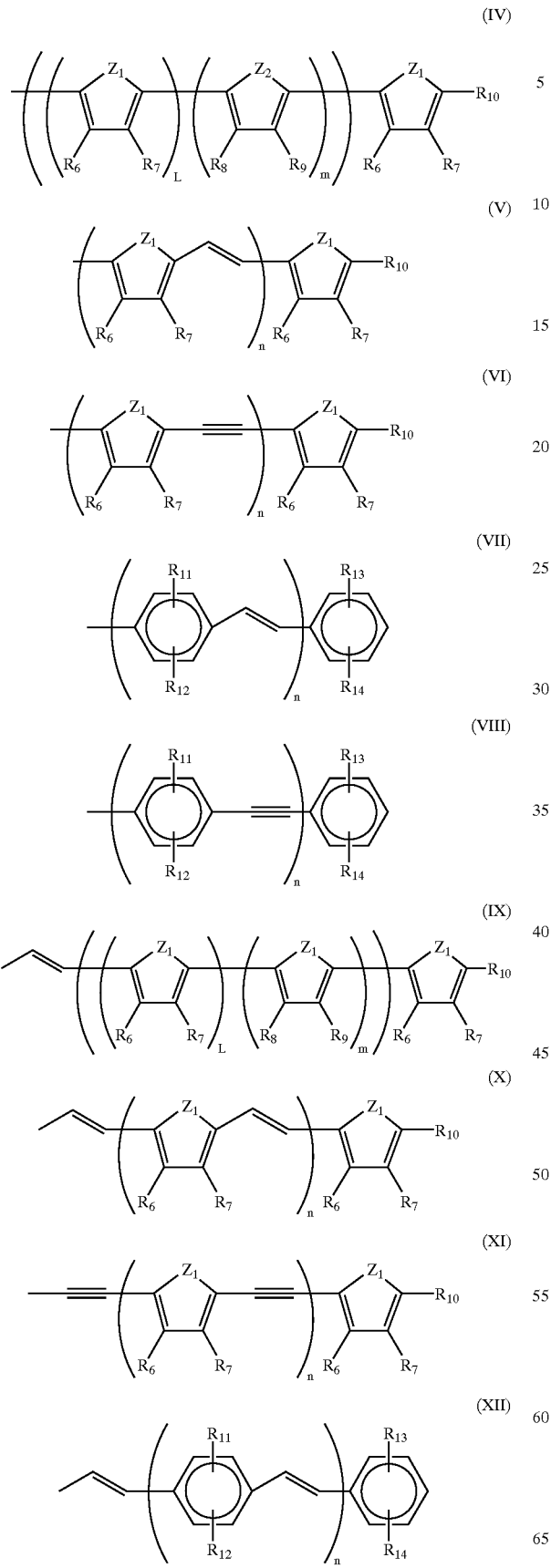

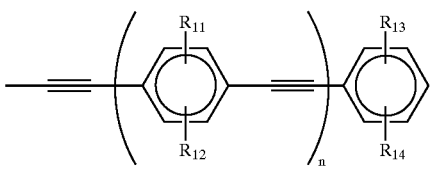

wherein $R_6$ to $R_{14}$ independently denote a hydrogen atom, an alkyl group, a substituted or unsubstituted aralkyl group, a substituted or unsubstituted aryl group, a substituted or unsubstituted heterocyclic group, an alkoxyl group, or a nitro group;

$Z_1$ and $Z_2$ independently denote —S—,

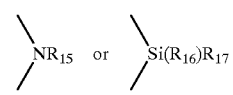

wherein $R_{15}$ denotes a hydrogen atom, an alkyl group, a substituted or unsubstituted aralkyl a group, a substituted or unsubstituted aryl group or a substituted or unsubstituted heterocyclic group; $R_{16}$ and $R_{17}$ independently denote an alkyl group, a substituted or unsubstituted aralkyl group, a substituted or unsubstituted aryl group or a substituted or unsubstituted heterocyclic group; and L denotes an integer of 0–20, m denotes an integer of 0–20 with the proviso that L+m makes an integer of 1–20, and n is an integer of 1–20.

2. An organic luminescence device according to claim 1, wherein the organic compound layer contains a spiro compound selected from those represented by the formulae [I] to [III] wherein both $X_1$ and $X_2$ are groups selected from those of the formulae (IV) to (XIII).

3. An organic luminescence device according to claim 1, wherein the organic compound layer contains a spiro compound selected from those represented by the formulae [I] to [III] wherein both $X_1$ and $X_2$ are groups selected from those of the formulae (IV) to (XIII) wherein L+m and n are integers of 2–8.

4. An organic luminescence device according to claim 1, wherein the organic compound layer comprises laminated layers including an electron-transporting layer and a luminescence layer, at least one of which contains at least one species of the spiro compounds represented by the formulae [I] to [III].

* * * * *

UNITED STATES PATENT AND TRADEMARK OFFICE
CERTIFICATE OF CORRECTION

PATENT NO.    : 6,458,476 B1
DATED         : October 1, 2002
INVENTOR(S)   : Koichi Suzuki et al.

It is certified that error appears in the above-identified patent and that said Letters Patent is hereby corrected as shown below:

Column 1,
Line 58, "alumininescence" should read -- luminiscence --.

Column 4,
Line 55, "groups a" should read -- a group, a --; and
Line 66, "alkyl" should be deleted.

Column 23,
"[Hole-material" should read -- [Hole-transporting material --.

Column 38,
Line 53, "wherein" should read -- , wherein --.

Column 39,
Line 42,

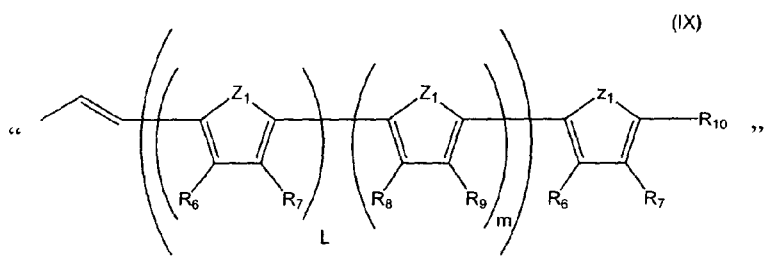

should read

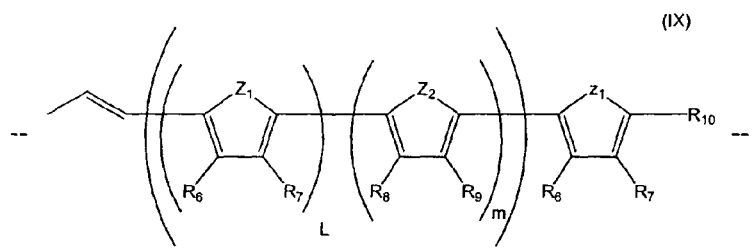

UNITED STATES PATENT AND TRADEMARK OFFICE
CERTIFICATE OF CORRECTION

PATENT NO.      : 6,458,476 B1
DATED           : October 1, 2002
INVENTOR(S)     : Koichi Suzuki et al.

It is certified that error appears in the above-identified patent and that said Letters Patent is hereby corrected as shown below:

<u>Column 40,</u>
Line 32, "a group," should read -- group, --.

Signed and Sealed this

Twentieth Day of May, 2003

JAMES E. ROGAN
*Director of the United States Patent and Trademark Office*